US011531228B2

(12) United States Patent
Zeng et al.

(10) Patent No.: US 11,531,228 B2
(45) Date of Patent: Dec. 20, 2022

(54) DISPLAY DEVICE AND METHOD FOR MANUFACTURING THE SAME

(71) Applicants: Chengdu BOE Optoelectronics Technology Co., Ltd., Sichuan (CN); BOE Technology Group Co., Ltd., Beijing (CN)

(72) Inventors: Li Zeng, Beijing (CN); Ce Wang, Beijing (CN); Qiang Tang, Beijing (CN); Xin Qing, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/278,697

(22) PCT Filed: May 15, 2020

(86) PCT No.: PCT/CN2020/090607
§ 371 (c)(1),
(2) Date: Mar. 23, 2021

(87) PCT Pub. No.: WO2021/227042
PCT Pub. Date: Nov. 18, 2021

(65) Prior Publication Data
US 2022/0113584 A1 Apr. 14, 2022

(51) Int. Cl.
*G02F 1/1335* (2006.01)
*G02F 1/1333* (2006.01)

(52) U.S. Cl.
CPC .... *G02F 1/133512* (2013.01); *G02F 1/13338* (2013.01); *G02F 1/133331* (2021.01)

(58) Field of Classification Search
CPC ......... G02F 1/133512; G02F 1/133331; G02F 1/13338
USPC .......................................................... 349/12
See application file for complete search history.

(56) References Cited

U.S. PATENT DOCUMENTS

| 10,534,221 | B1 | 1/2020 | Zhu | |
|---|---|---|---|---|
| 2019/0235653 | A1* | 8/2019 | Chen | G02B 5/003 |
| 2021/0057490 | A1* | 2/2021 | Choi | H01L 51/5246 |

FOREIGN PATENT DOCUMENTS

| CN | 108681131 A | 10/2018 |
|---|---|---|
| CN | 109100892 A | 12/2018 |
| CN | 110138935 A | 8/2019 |

(Continued)

*Primary Examiner* — Charles S Chang
(74) *Attorney, Agent, or Firm* — Fay Sharpe LLP

(57) ABSTRACT

Provided is a display device, including a display screen, a transparent cover plate and a first light-shielding structure, wherein the display screen includes a display panel, a transparent bonding layer, a touch structure and a second light-shielding structure, and the display screen is provided with a through hole penetrating through the display panel, the transparent bonding layer and the touch structure. The first light-shielding structure is disposed on the transparent cover plate and surrounds the through hole, the second light-shielding structure is disposed on the touch structure and surrounds the through hole, and orthographic projections of both the first and second light-shielding structures onto the display panel are within the non-display region.

18 Claims, 8 Drawing Sheets

(56) References Cited

FOREIGN PATENT DOCUMENTS

| CN | 110687710 A | 1/2020 |
| CN | 111081751 A | 4/2020 |

* cited by examiner

DISPLAY DEVICE AND METHOD FOR MANUFACTURING THE SAME

CROSS-REFERENCE TO RELATED APPLICATIONS

This application is a 371 of PCT Application No. PCT/CN2020/090607, filed on May 15, 2020, the disclosures of which are herein incorporated by reference in their entireties.

TECHNICAL FIELD

The present disclosure relates to the field of display equipment, and particularly relates to a display device and a method for manufacturing the same.

BACKGROUND

In order to increase a screen-to-body ratio in a display device with a camera, it is generally necessary to form a hole in a display screen to arrange the camera in the hole.

SUMMARY

Embodiments of the present disclosure provide a display device and a method for manufacturing the same.

In one aspect, the embodiments of the present disclosure provide a display device, including:
a display screen including:
  a display panel including a non-display region and a display region,
  a transparent bonding layer,
  a touch structure,
  a second light-shielding structure, and
  a through hole;
a transparent cover plate; and
a first light-shielding structure;
wherein:
  the transparent bonding layer, the touch structure and the transparent cover plate are sequentially laminated on the display panel;
  the through hole penetrates through the display panel, the transparent bonding layer, and the touch structure, and the non-display region surrounds the through hole and the display region surrounds the non-display region; and
  the first light-shielding structure is disposed on the transparent cover plate and surrounds the through hole, the second light-shielding structure is disposed on the touch structure and surrounds the through hole, an orthographic projection of the first light-shielding structure onto the display panel and an orthographic projection of the second light-shielding structure onto the display panel both are within the non-display region, and the first light-shielding structure is configured to shield light through the through hole and slantly incident on the transparent cover plate from a side, proximal to the display panel, of the second light-shielding structure.

Optionally, the first light-shielding structure is ring-shaped, an inner diameter of the first light-shielding structure is less than a diameter of the through hole, and an outer diameter of the first light-shielding structure is greater than the diameter of the through hole.

Optionally, the inner diameter of the first light-shielding structure satisfies the following relations:

$$D_1 \leq \frac{2h}{\tan\alpha} - D_0, \text{ and } \sin\alpha = \frac{nd}{a},$$

wherein $D_1$ is the inner diameter of the first light-shielding structure, h is a vertical distance between the first light-shielding structure and the second light-shielding structure, $D_0$ is a diameter of the through hole, n is a refractive index of the transparent bonding layer, d is a thickness of the transparent bonding layer, and a is a minimum distance from a boundary between the non-display region and the display region to the through hole in a radial direction of the through hole.

Optionally, the inner diameter of the first light-shielding structure satisfies the following relation:

$$D_1 \leq D_0 - 2\sqrt{m_1^2 + m_2^2 + m_3^2},$$

wherein $D_1$ is an inner diameter of the first light-shielding structure, $D_0$ is a diameter of the through hole, $m_1$ is a geometric tolerance of the through hole, $m_2$ is a fit tolerance between the transparent cover plate and the display panel, and $m_3$ is a geometric tolerance of the first light-shielding structure.

Optionally, the inner diameter of the first light-shielding structure satisfies the following relations:

$$D_1 \leq \min\left\{\frac{2h}{\tan\alpha} - D_0; D_0 - 2\sqrt{m_1^2 + m_2^2 + m_3^2}\right\}, \text{ and } \sin\alpha = \frac{nd}{a},$$

wherein h is a vertical distance between the first light-shielding structure and the second light-shielding structure, n is a refractive index of the transparent bonding layer, d is a thickness of the transparent bonding layer, and a is a minimum distance from a boundary between the non-display region and the display region to the through hole in a radial direction of the through hole.

Optionally, the outer diameter of the first light-shielding structure satisfies the following relation:

$$D_2 = D_0 + 2a - 2\sqrt{m_2^2 + m_3^2},$$

wherein $D_2$ is the outer diameter of the first light-shielding structure, $D_0$ is the diameter of the through hole, a is the minimum distance from a boundary between the non-display region and the display region to the through hole in the radial direction of the through hole, $m_2$ is the fit tolerance between the transparent cover plate and the display panel, and $m_3$ is the geometric tolerance of the first light-shielding structure.

Optionally, the second light-shielding structure is ring-shaped; and an inner diameter of the second light-shielding structure is the same as a diameter of the through hole.

Optionally, an outer diameter of the second light-shielding structure satisfies the following relation:

$$D_3 = D_0 + 2a - 2\sqrt{m_4^2 + m_5^2},$$

wherein $D_3$ is the outer diameter of the second light-shielding structure, $D_0$ is the diameter of the through hole, a is the minimum distance from the boundary between the non-display region and the display region to the through hole in the radial direction of the through hole, $m_4$ is a fit tolerance between the touch structure and the display panel, and $m_5$ is a geometric tolerance of the second light-shielding structure.

Optionally, the orthographic projection of the second light-shielding structure onto the display panel is within the orthographic projection of the first light-shielding structure onto the display panel.

Optionally, the touch structure is provided with a first surface proximal to the display panel and a second surface proximal to the transparent cover plate, and the second light-shielding structure is disposed on the first surface, or on the second surface, or between the first surface and the second surface.

Optionally, the touch structure includes a substrate layer, a plurality of touch electrodes and an insulating layer, wherein the plurality of touch electrodes is disposed on a surface of the substrate layer, the insulating layer covers the plurality of touch electrodes; and the second light-shielding structure is disposed on the substrate layer or on the insulating layer.

Optionally, a thickness of each of the first and second light-shielding structures ranges from 1 μm to 5 μm.

Optionally, each of the first and second light-shielding structures is made of an ink or an opaque photoresist.

Optionally, a photoresist layer includes a black carbon particle.

In another aspect, the embodiments of the present disclosure further provide a method for manufacturing a display device, the method including:

providing a transparent cover plate, a touch structure and a display panel;

forming a first light-shielding structure on the transparent cover plate;

forming a light-shielding pattern on the touch structure;

bonding the touch structure to the display panel by a transparent bonding layer;

forming a through hole penetrating through the display panel, the transparent bonding layer, the light-shielding pattern and the touch structure to obtain a display screen with a second light-shielding structure, wherein the display panel is provided with a non-display region surrounding the through hole and a display region surrounding the non-display region, the second light-shielding structure includes a remaining part of the light-shielding pattern after forming the through hole, and surrounds the through hole, and an orthographic projection of the second light-shielding structure onto the display panel is within the non-display region; and disposing the transparent cover plate on the touch structure, such that the first light-shielding structure surrounds the through hole, wherein an orthographic projection of the first light-shielding structure onto the display panel is within the non-display region, and the first light-shielding structure is configured to shield light through the through hole and slantly incident on the transparent cover plate from a side, proximal to the display panel, of the second light-shielding structure.

Optionally, said forming the light-shielding pattern on the touch structure includes:

providing a substrate layer;

forming a plurality of touch electrodes on one surface of the substrate layer;

forming an insulating layer on the plurality of touch electrodes; and forming the light-shielding pattern on at least one of the insulating layer and the other surface of the substrate layer to obtain the touch structure.

Optionally, the method further includes:

said forming the light-shielding pattern on the touch structure includes:

providing a substrate layer;

forming a plurality of touch electrodes and the light-shielding pattern on one surface of the substrate layer; and forming an insulating layer on the plurality of touch electrodes and the light-shielding pattern to obtain the touch structure.

BRIEF DESCRIPTION OF THE DRAWINGS

In order to describe the technical solutions of the embodiments provided by the present disclosure more clearly, the following briefly introduces the accompanying drawings required for describing the embodiments. Apparently, the accompanying drawings in the following description show merely some embodiments of the present disclosure, and persons of ordinary skilled in the art may also derive other drawings from these accompanying drawings without creative efforts.

DETAILED DESCRIPTION

For clearer descriptions of the objectives, technical solutions and advantages of the present disclosure, the embodiments of the present disclosure are described in detail with reference to the accompanying drawings.

Figure 1:
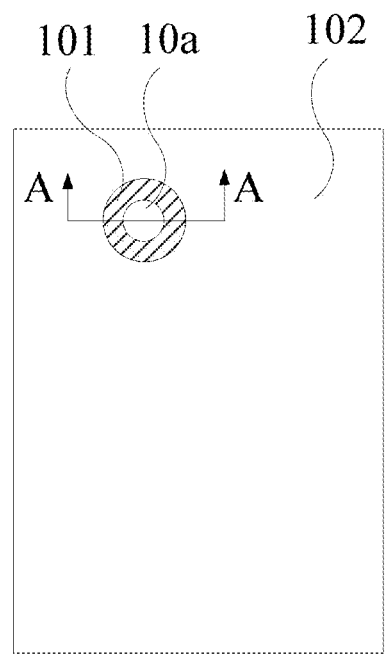
FIG. 1 is a top view of a display device in the related art.
Figure 2:
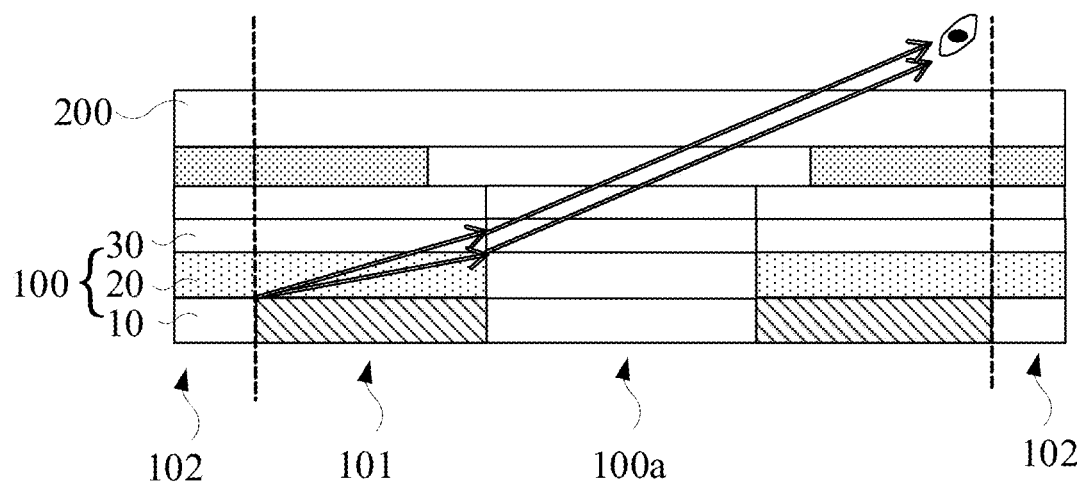
FIG. 2 is a sectional view of A-A in FIG. 1.

FIG. 1 is a top view of a display device in the related art. FIG. 2 is a sectional view of A-A in FIG. 1. As shown in FIG. 2, the display device includes a display screen 100 and a transparent cover plate 200 laminated on the display screen 100. The display screen 100 includes a display panel 10, a transparent bonding layer 20 and a touch structure 30 that are sequentially laminated. The display screen 100 is provided with a through hole 100a penetrating through the display panel 10, the transparent bonding layer 20 and the touch structure 30. The display panel 10 includes a non-display region 101 surrounding the through hole 100a and a display region 102 surrounding the non-display region 101. The display region 102 is used for image display, and the non-display region 101 is not used for image display. In FIG. 2, a boundary between the display region 102 and the non-display region 101 is indicated by two parallel-spaced dashed lines.

As shown in FIG. 2, part of the light emitted from the display panel 10 slants toward the through hole 100a and enters the through hole 100a from the wall of the through hole. When viewing the display device from a certain angle, this part of the light enters eyes of an observer, thereby adversely affecting a display effect of the display device.

Figure 3:
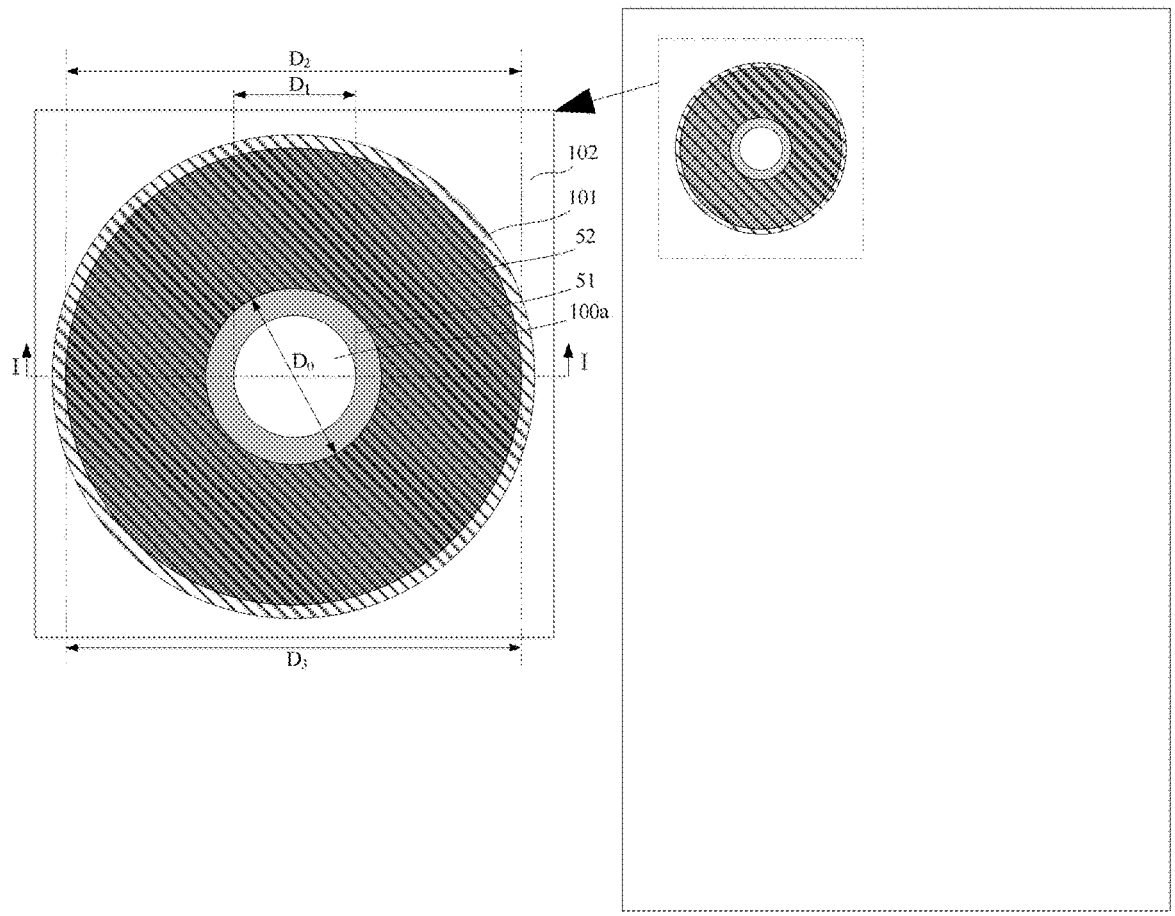
FIG. 3 is a schematic diagram of a partial structure of a display device according to an embodiment of the present disclosure.
Figure 4:
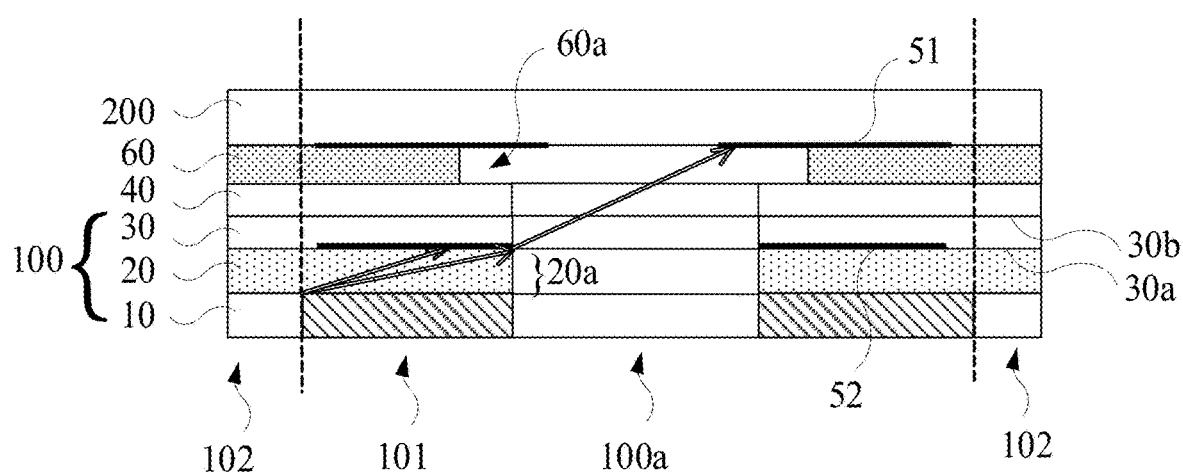
FIG. 4 is a sectional view of I-I in FIG. 3.

FIG. 3 is a schematic diagram of a partial structure of a display device according to an embodiment of the present disclosure. The display device may be a mobile phone, a tablet computer, a TV, a display, a notebook computer, a digital photo frame, a navigator, or any other product or component having a display function. FIG. 4 is a sectional view of I-I in FIG. 3, as shown in FIG. 4, the display device includes a display screen 100, a transparent cover plate 200 and a first light-shielding structure 51. The display screen 100 includes a display panel 10, a transparent bonding layer 20, a touch structure 30 and a second light-shielding structure 52. The transparent bonding layer 20, the touch structure 30 and the transparent cover plate 200 are sequentially laminated on the display panel 10.

The "sequentially" in the present disclosure only defines a relative relationship of the listed structures, and does not mean that the listed structures must be in direct contact with each other. For example, in "the transparent bonding layer 20, the touch structure 30 and the transparent cover plate 200 are sequentially laminated on the display panel 10", the display panel 10, the transparent bonding layer 20, the touch structure 30 and the transparent cover plate 200 are not necessarily in direct contact with each other, that is, another structure may be disposed between any two structures.

Optionally, the transparent cover plate 200 is a cover glass (CG).

Optionally, the transparent bonding layer 20 is a bottom optical clear adhesive (BOCA). The BOCA has higher transparency, which can reduce the influence on the brightness of the display panel 10.

The display screen 100 is provided with a through hole 100a penetrating through the display panel 10, the transparent bonding layer 20 and the touch structure 30. The display panel 10 includes a non-display region 101 surrounding the through hole 100a and a display region 102 surrounding the non-display region 101.

The first light-shielding structure 51 is disposed on the transparent cover plate 200 and surrounds the through hole 100a. The second light-shielding structure 52 is disposed on the touch structure 30 and surrounds the through hole 100a. The orthographic projection of the first light-shielding structure 51 onto the display panel 10 and the orthographic projection of the second light-shielding structure 52 onto the display panel 10 both fall within the non-display region 101.

The first light-shielding structure 51 is configured to shield light through the through hole 100a and slantly incident on the transparent cover plate 200 from a side, proximal to the display panel 10, of the second light-shielding structure 52.

In the present disclosure, "slantly incident on the transparent cover plate 200" means that the light is incident on the transparent cover plate 200 and is not perpendicular to the transparent cover plate 200.

The first light-shielding structure on the transparent cover plate and the second light-shielding structure on the touch structure can shield the light emitted from the display panel. Since both the first light-shielding structure and the second light-shielding structure surround the through hole penetrating through the display panel, the transparent bonding layer and the touch structure, and the orthographic projections of both the first light-shielding structure and the second light-shielding structure fall within the non-display region, the light emitted from the display panel is shielded by the second light-shielding structure after slantly passing through the transparent bonding layer in the direction of the through hole, such that most of the light cannot enter the through hole, and a small part of the light enters the through hole from a side, proximal to the display panel, of the second light-shielding structure and is slantly incident on the transparent cover plate. Moreover, this part of the light is shielded by the first light-shielding structure, and thus is prevented from exiting the through hole. Thus, this part of the light is prevented from being observed by an observer, which is beneficial to the improvement of the display effect of the display device.

The first light-shielding structure 51 and the second light-shielding structure 52 are both ring-shaped. "Both the first light-shielding structure 51 and the second light-shielding structure 52 surround the through hole 100a" means that the first light-shielding structure 51 and the second light-shielding structure 52 are concentric with the through hole 100a.

Optionally, the display screen 100 further includes a polarizer (POL) 40 disposed between the touch structure 30 and the transparent cover plate 200. The polarizer 40 is connected to the transparent cover plate 200 by a top optical clear adhesive (TOCA) 60.

As shown in FIG. 4, there is a gap 60a between the TOCA 60 and the through hole 100a in the radial direction of the through hole 100a, so as to prevent the TOCA 60 from overflowing into the through hole 100a due to extrusion when the polarizer 40 and the transparent cover plate 200 are bonded.

Optionally, the first light-shielding structure 51 is disposed on one surface, proximal to the display panel 10, of the transparent cover plate 200. In this way, the first light-shielding structure 51 can be prevent from falling off during the use of the display device, as the transparent cover plate 200 is a structure that can be directly touched usually.

As shown in FIG. 4, the touch structure 30 is provided with a first surface 30a proximal to the display panel 10 and a second surface 30b proximal to the transparent cover plate 200. The second light-shielding structure 52 is disposed on the first surface 30a. After passing through the transparent bonding layer 20, part of the light emitted from the display panel 10 is directly shielded by the second light-shielding structure 52 on the first surface 30a, thereby not entering the touch structure 30. The light enters the through hole 100a only from a region on a hole wall disposed on a side, proximal to the display panel 10, of the second light-shielding structure 52, wherein the region (the region 20a in FIG. 4) has a width equal to a thickness of the transparent bonding layer 20.

Figure 5:
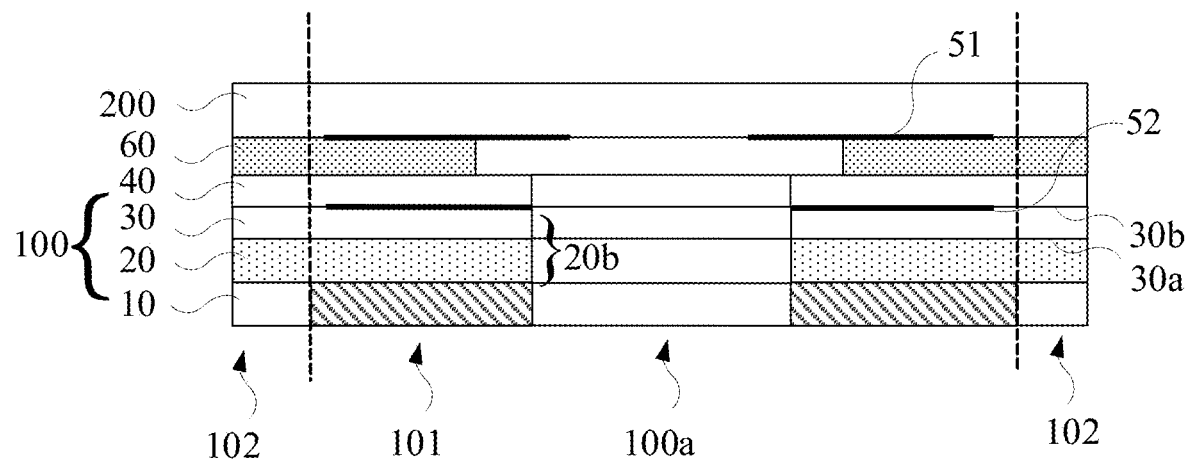
FIG. 5 is a schematic diagram of a partial structure of a display device according to another embodiment of the present disclosure.

FIG. 5 is a schematic diagram of a partial structure of a display device according to an embodiment of the present disclosure. As shown in FIG. 5, in the display device, the second light-shielding structure 52 is disposed on the second surface 30b. In this way, part of the light emitted from the display panel 10 enters the touch structure 30 after passing through the transparent bonding layer 20, and is shielded by the second light-shielding structure 52 on the second surface 30b. The light enters the through hole 100a from a region on the hole wall disposed on one side, proximal to the display panel 10, of the second light-shielding structure 52, wherein the region (the region 20b in FIG. 5) has a width equal to a sum of the thickness of the transparent bonding layer 20 and a thickness of the touch structure 30.

Figure 6:
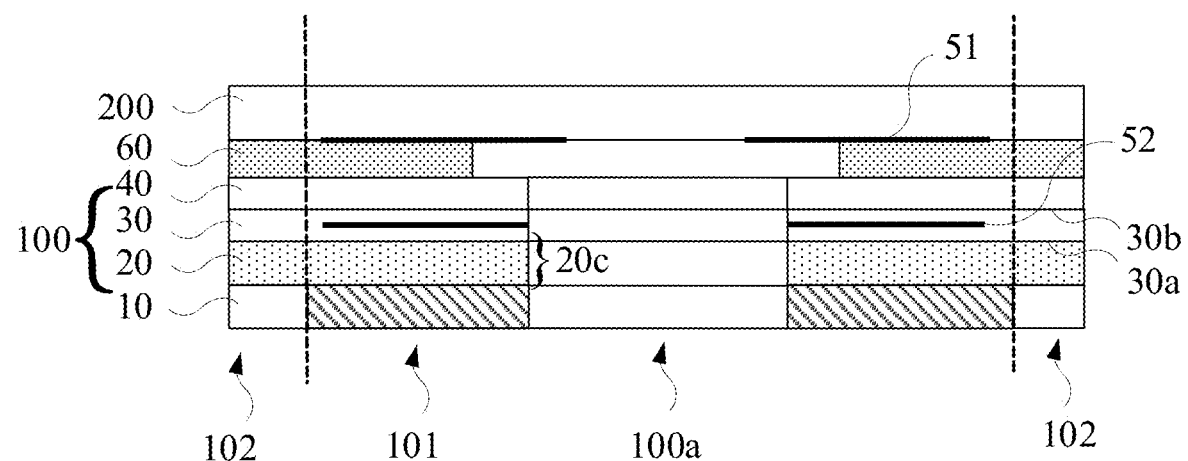
FIG. 6 is a schematic diagram of a partial structure of a display device according to yet another embodiment of the present disclosure.

FIG. 6 is a schematic diagram of a partial structure of a display device according to yet another embodiment of the present disclosure. As shown in FIG. 6, in the display device, the second light-shielding structure 52 is disposed between the first surface 30a and the second surface 30b. That is, the second light-shielding structure 52 is disposed in the touch structure 30. In this way, part of the light emitted from the display panel 10 enters the touch structure 30 after passing through the transparent bonding layer 20, and is shielded by the second light-shielding structure 52 in the touch structure 30. The light enters the through hole 100a from a region on the hole wall disposed on one side, proximal to the display panel 10, of the second light-shielding structure 52, wherein the region (the region 20c in FIG. 6) has a width less than the sum of the thickness of the transparent bonding layer 20 and the thickness of the touch structure 30.

FIGS. 4 to 6 show three arrangements of the second light-shielding structure 52 as examples. In order to further improve the shielding effect of the second light-shielding structure 52 on light and reduce the possibility of light transmission, the second light-shielding structure 52 is disposed on the first surface 30a of the touch structure 30, or on the second surface 30b of the touch structure 30, or between the first surface 30a and the second surface 30b.

Figure 7:
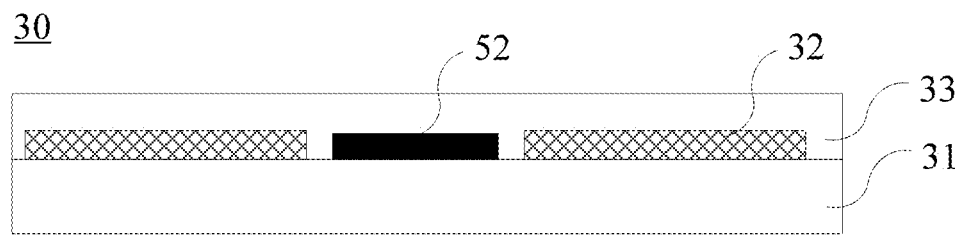
FIG. 7 is a schematic diagram of a partial structure of a touch structure according to an embodiment of the present disclosure.

FIG. 7 is a schematic diagram of a partial structure of a touch structure according to an embodiment of the present disclosure. As shown in FIG. 7, the touch structure 30 includes a substrate layer 31, a plurality of touch electrodes 32 and an insulating layer 33. The plurality of touch electrodes 32 is disposed on a surface of the substrate layer 31, and the insulating layer 33 covers the plurality of touch electrodes 32. The second light-shielding structure 52 and the plurality of touch electrodes 32 are disposed on a same surface of the substrate layer 31. The second light-shielding structure 52 is covered with the insulating layer 33, that is, the second light-shielding structure 52 is disposed in the touch structure 30. During an aging process of the display device, the second light-shielding structure 52 may fade under the erosion of water, oxygen, etc., resulting in reduction of the shielding effect on light. By using the insulating layer 33 to cover the second light-shielding structure 52 and the plurality of touch electrodes 32, the insulating layer 33 can protect the second light-shielding structure 52 and reduce an erosion rate of the second light-shielding structure 52 by water, oxygen and the like while providing insulation.

The touch structure 30 may be a resistive touch structure, a capacitive touch structure, an infrared touch structure, and the like according to a working principle. In these touch structures 30, the capacitive touch structure has the advantages of a higher sensitivity, a longer service life, a higher light transmission, and the like. Generally, the capacitive touch structure may be a self-capacitance touch structure or a mutual-capacitance touch structure. In the case that the capacitive touch structure is the self-capacitance touch structure, the plurality of touch electrodes 32 only includes self-capacitance electrodes. In the case that the capacitive touch structure is the mutual-capacitance touch structure, the plurality of touch electrodes 32 includes a touch-driving electrode and a touch-sensing electrode.

Figure 8:
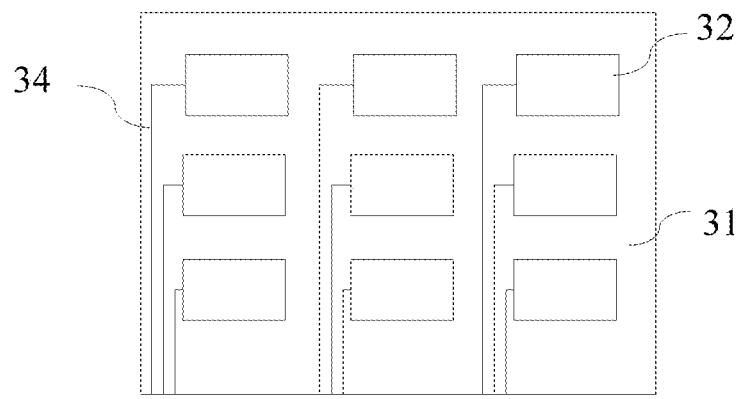
FIG. 8 is a top view of a touch structure according to an embodiment of the present disclosure.

FIG. 8 is a top view of a touch structure according to an embodiment of the present disclosure. The touch structure is a self-capacitance touch structure. As shown in FIG. 8, the plurality of touch electrodes 32 is distributed on the substrate layer 31 in an array, and the touch structure 30 further includes a plurality of touch signal lines 34 which are connected to the plurality of touch electrodes 32 in a one-to-one correspondence.

Figure 9:
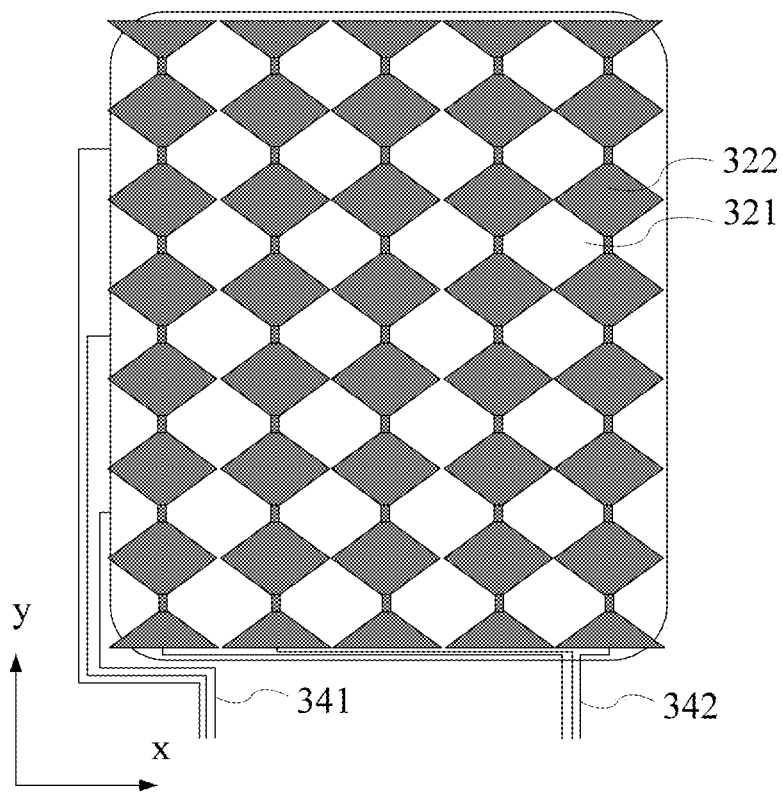
FIG. 9 is a top view of a touch structure according to another embodiment of the present disclosure.

FIG. 9 is a top view of a touch structure according to another embodiment of the present disclosure. The touch structure is a mutual-capacitance touch structure. As shown in FIG. 9, the plurality of touch electrodes 32 includes first touch electrodes 321 and second touch electrodes 322. The plurality of first touch electrodes 321 constitutes a first touch electrode line extending in an x direction. The plurality of second touch electrodes 322 constitutes a second touch electrode line extending in a y direction. The plurality of first touch electrode lines and the plurality of second touch electrode lines cross each other, such that a capacitance touch is formed at each of crossing positions of the first touch electrode lines and the second touch electrode lines. Detection of a touch position is realized by detecting a change of a capacitance of the capacitance touch caused by, for example, the approach of a finger during touch. The touch structure 30 further includes a plurality of first touch signal lines 341 and a plurality of second touch signal lines 342. Each of the first touch signal lines 341 is electrically connected to the first touch electrode line extending in the x direction, and each of the second touch signal lines 342 is electrically connected to the second touch electrode line extending in the y direction. For the purpose of simplification, only three first touch signal lines 341 and three second touch signal lines 342 are shown in FIG. 9. In specific implementation, each first touch electrode line is electrically connected to one first touch signal line 341; and each second touch electrode line is electrically connected to one second touch signal line 342. In this way, the touch signal generated by each touch electrode 32 can be transmitted to an external touch chip through the first touch signal line 341 or the second touch signal line 342.

In some embodiments, the substrate layer 31 is a polyimide (PI) thin film, a polyethylene terephthalate (PET) thin film, or a cycloolefin polymer (COP) thin film.

The touch electrode 32 is made of indium tin oxide (ITO) which is conductive and transparent and which is suitable for manufacturing the touch electrode.

The insulating layer 33 is made of one or more of $SiO_X$, $SiN_X$ and $SiN_xO_y$.

As an example, FIG. 7 shows an arrangement of the second light-shielding structure 52 in the touch structure 30. When the touch structure 30 is connected to the display panel 10, the transparent bonding layer 20 is bonded to the substrate layer 31, or the transparent bonding layer 20 is bonded to the insulating layer 33. In the case that the transparent bonding layer 20 is bonded to the substrate layer 31, the surface, distal form the insulating layer 33, of the substrate layer 31 is the first surface 30a of the touch structure 30. in the case that the transparent bonding layer 20 is bonded to the insulating layer 33, the surface, distal from the insulating layer 33, of the substrate layer 31 is the second surface 30b of the touch structure 30. Corresponding to the display devices shown in FIGS. 4 and 5, the second light-shielding structure 52 is disposed on the surface, distal from the insulating layer 33, of the substrate layer 31, or the second light-shielding structure 52 is disposed on the insulating layer 33.

Optionally, each of the first light-shielding structure 51 and the second light-shielding structure 52 is made of ink or an opaque photoresist. The ink is formed by a screen-printing process, and the photoresist is formed by a patterning process. Both the screen-printing process and the patterning process have higher accuracy, which is beneficial to manufacture of the first light-shielding structure 51 and the second light-shielding structure 52 with high size accuracy.

Optionally, the photoresist includes a black carbon particle. The mixing of the black carbon particle in the photoresist can improve the shielding effect of the first light-shielding structure 51 and the second light-shielding structure 52 on light, thereby reducing the transmission of the light.

Optionally, the thickness of the first light-shielding structure 51 ranges from 1 μm to 5 μm, and the thickness of the second light-shielding structure 52 ranges from 1 μm to 5 μm. The thickness of the first light-shielding structure 51 and the thickness of the second light-shielding structure 52 have an influence on the bonding of the display panel 10, the touch structure 30 and the transparent cover plate 200. The larger the thicknesses of the first light-shielding structure 51 and the second light-shielding structure 52 are, the greater the influence is. The smaller the thicknesses are, the weaker the shielding effect on the light is. Thus, on the premise of ensuring that the first light-shielding structure 51 and the second light-shielding structure 52 have a sufficient shielding effect on the light, the thicknesses of the first light-shielding structure 51 and the second light-shielding structure 52 should be reduced as much as possible. In the thickness range of 1 μm to 5 μm, the first light-shielding structure 51 and the second light-shielding structure 52 have a sufficient shielding effect on the light, and have a little influence on the bonding of the display panel 10, the touch structure 30 and the transparent cover plate 200. In some embodiments, the thicknesses of the first light-shielding structure 51 and the second light-shielding structure 52 are both 2 μm.

The size of the first shading structure 51 and the size of the second shading structure 52 also have a great influence on their light-shielding effect. The first shading structure 51 and the second shading structure 52 with appropriate sizes can further prevent light from exiting the through hole from the interior thereof, thereby further improving the display effect of the display device. The size of the first light shielding structure 51 and the size of the second light shielding structure 52 are described in detail below.

Figure 10:
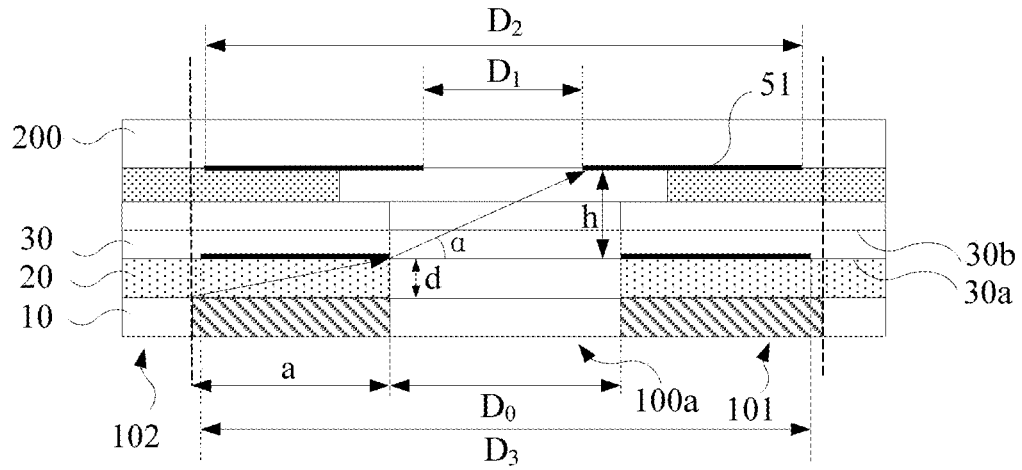
FIG. 10 is a schematic diagram of a partial structure of a display device according to still another embodiment of the present disclosure.

FIG. 10 is a schematic diagram of a partial structure of a display device according to still another embodiment of the present disclosure. As shown in FIG. 3 and FIG. 10, for the first light-shielding structure 51, the inner diameter of the first light-shielding structure 51 is less than the diameter of the through hole 100a, and the outer diameter of the first light-shielding structure 51 is greater than the diameter of the through hole 100a. As the inner diameter of the first light-shielding structure 51 is less than the diameter of the through hole 100a, the light that would originally slantly exit the through hole 100a will irradiate the first light-shielding structure 51 and be shielded by the first light-shielding structure 51.

Optionally, the inner diameter of the first light-shielding structure 51 satisfies the following relations:

$$D_1 \leq \frac{2h}{\tan\alpha} - D_0, \text{ and} \qquad (1)$$

$$\sin\alpha = \frac{nd}{a}, \qquad (2)$$

wherein $D_1$ is the inner diameter of the first light-shielding structure 51, h is a vertical distance between the first light-shielding structure 51 and the second light-shielding structure 52, $D_0$ is the diameter of the through hole 100a, n is a refractive index of the transparent bonding layer 20, d is a thickness of the transparent bonding layer 20, and a is a minimum distance from a boundary between the non-display region 101 and the display region 102 to the through hole 100a in a radial direction of the through hole 100a.

Optionally, the refractive index of the transparent bonding layer 20 ranges from 1.45 to 1.5. In some embodiments, the refractive index of the transparent bonding layer 20 is 1.47.

As the non-display region 101 is generally ring-shaped, the boundary between the non-display region 101 and the display region 102 is usually circular. The minimum distance from the boundary between the non-display region 101 and the display region 102 to the through hole 100a is a ring width of the non-display region 101. As shown in FIG. 10, according to the geometric relationship, the maximum refraction angle α of light refracted from the region into the through hole 100a satisfies the equation (2). If the light entering the through hole 100a at the maximum refraction angle α can be shielded by the first light-shielding structure 51, the light entering the through hole 100a at a smaller refraction angle will only reach the first light-shielding structure 51 or the hole wall, and will not exit the through hole 100a. Thus, the inner diameter of the first light-shielding structure 51, satisfying the equations (1) and (2), can ensure that the light can be shielded by the first light shielding structure 51.

In a process of manufacturing the display device, there are some inevitable deviations, such as a geometric tolerance of the through hole 100a, the fit tolerance between the transparent cover plate 200 and the display panel 10, and a geometric tolerance of the first light-shielding structure 51. These deviations adversely affect the shielding effect of the first shading structure 51 on light, and cause part of the light incident on the through hole 100a from the display region and directed to the transparent cover plate 200 cannot be shielded by the first light-shielding structure 51. Taking FIG. 10 as an example, if the first light-shielding structure 51 is shifted to the right by a slight distance relative to the position shown in the figure due to the influence of the fit tolerance between the transparent cover plate 200 and the display panel 10, part of light shown in the figure cannot reach the first light shielding structure 51 and can exit the through hole 100a. In order to avoid this problem, the inner diameter of the first light-shielding structure 51 satisfies the following relation:

$$D_1 \leq D_0 - 2\sqrt{m_1^2 + m_2^2 + m_3^2}, \qquad (3),$$

wherein $m_1$ is the geometric tolerance of the through hole 100a, $m_2$ is the fit tolerance between the transparent cover plate 200 and the display panel 10, and $m_3$ is the geometric tolerance of the first light-shielding structure 51.

In order to ensure that the light incident on the through hole 100*a* from the display region and directed to the transparent cover plate 200 can be shielded by the first light-shielding structure 51, the inner diameter of the first light-shielding structure 51 needs to satisfy both the equations (1) and (3). That is, the inner diameter of the first light-shielding structure 51 satisfies the following relation:

$$D_1 \leq \min\left\{\frac{2h}{\tan\alpha} - D_0; -D_0 - 2\sqrt{m_1^2 + m_2^2 + m_3^2}\right\}. \quad (4)$$

If the inner diameter of the first light-shielding structure 51 satisfies the equation (4), it must satisfy both the equations (1) and (3).

If a part of the orthographic projection of the first light-shielding structure 51 onto the display panel 10 falls within the display region 102, the first light-shielding structure 51 will shield the image displayed in the display region 102. Although the orthographic projection of the first light-shielding structure 51 onto the display panel 10 is required to be disposed outside the display region 102 in the design to avoid this situation, deviations in the manufacturing process may cause that the part of the orthographic projection of the first light-shielding structure 51 onto the display panel 10 falls within the display region 102. Still taking FIG. 10 as an example, if the first light-shielding structure 51 is shifted to the right by a slight distance relative to the position shown in the figure due to the influence of the fit tolerance between the transparent cover plate 200 and the display panel 10 in the process of bonding the transparent cover plate 200 and the display panel 10, the part of the orthographic projection of the first light-shielding structure 51 onto the display panel 10 may fall within the display region 102. In order to avoid this problem, the outer diameter of the first light-shielding structure 51 satisfies the following relation:

$$D_2 = D_0 + 2a - 2\sqrt{m_2^2 + m_3^2}, \quad (5),$$

wherein $D_2$ is the outer diameter of the first light-shielding structure 51.

The outer diameter of the first light-shielding structure 51 is defined by the equation (5), and the maximum inner diameter of the first light-shielding structure 51 is defined by the equations (1) and (3). Thus, the size of the first light-shielding structure 51 is determined.

In the radial direction of the through hole 100*a*, the distance between the first light-shielding structure 51 and the display region 102 is $\sqrt{m_2^2 + m_3^2}$.

The distance between the first light-shielding structure 51 and the display region 102 may range from 0.1 mm to 0.3 mm.

Here, $m_1$ may not exceed 50 μm, and the tolerance should be as less as possible in the case that the process can be achieved, which is beneficial to the improvement of the shielding effect of the light.

For the second light-shielding structure 52, as shown in FIG. 10, the inner diameter of the second light-shielding structure 52 and the inner diameter of the through hole 100*a* are the same. As it is impossible for the second light shielding structure 52 to extend into the through hole 100*a*, in order to maximize a light-shielding range of the second light shielding structure 52, the inner diameter of the second light-shielding structure 52 and the inner diameter of the through hole 100*a* are the same.

If a part of the orthographic projection of the second light-shielding structure 52 onto the display panel 10 falls within the display region 102, the second light-shielding structure 52 will shield the image displayed in the display region 102. Although the orthographic projection of the second light-shielding structure 52 onto the display panel 10 is required to be disposed outside the display region 102 in the design to avoid this situation, deviations in the manufacturing process may cause that the part of the orthographic projection of the second light-shielding structure 52 onto the display panel 10 falls within the display region 102. Still taking FIG. 10 as an example, if the second light-shielding structure 52 is shifted to the right by a slight distance relative to the position shown in the figure due to the influence of the fit tolerance between the touch structure 30 and the display panel 10 in the process of bonding the touch structure 30 and the display panel 10, the part of the orthographic projection of the second light-shielding structure 52 onto the display panel 10 may fall within the display region 102. In order to avoid this problem, the outer diameter of the second light-shielding structure 52 satisfies the following relation:

$$D_3 = D_0 + 2a - 2\sqrt{m_4^2 + m_5^2}, \quad (6),$$

wherein $D_3$ is the outer diameter of the second light-shielding structure 52; $m_4$ is the fit tolerance between the touch structure 30 and the display panel 10; and $m_5$ is a geometric tolerance of the second light-shielding structure 52.

In the radial direction of the through hole 100*a*, the distance between the second light-shielding structure 52 and the display region 102 is $\sqrt{m_4^2 + m_5^2}$.

The distance between the second light-shielding structure 52 and the display region 102 may range from 0.1 mm to 0.2 mm.

Optionally, the orthographic projection of the second light-shielding structure 52 onto the display panel 10 falls within the orthographic projection of the first light-shielding structure 51 onto the display panel 10. As the first light-shielding structure 51 and the second light-shielding structure 52 are not on the same plane, even if the first light-shielding structure 51 and the second light-shielding structure 52 are set in the same color to enable them to be visually integrated as much as possible, it is still possible for an observer to see the boundary between the first light-shielding structure 51 and the second light-shielding structure 52 when observing the display device from a side of the transparent cover plate 200. By enabling the orthographic projection of the second light-shielding structure 52 onto the display panel 10 to fall within the orthographic projection of the first light-shielding structure 51 onto the display panel 10, the first light-shielding structure 51 can shield the second light-shielding structure 52, such that the second light-shielding structure 52 is hardly detectable for the observer, which is beneficial to the improvement of a visual effect of the display device.

Figure 11:
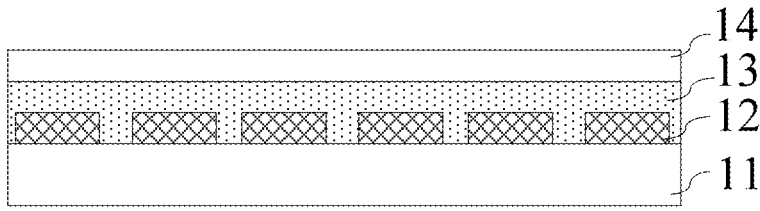
FIG. 11 is a schematic structural diagram of a display panel according to an embodiment of the present disclosure.

Optionally, the display panel 10 is an organic light-emitting diode (OLED) display panel. FIG. 11 is a schematic structure diagram of a display panel according to an embodiment of the present disclosure. As shown in FIG. 11, the display panel 10 includes an array substrate 11, a light-emitting component 12, a water-resisting layer 13 and a planarization layer 14 which are sequentially laminated. The light-emitting component 12 may be an OLED component. The water-resisting layer 13 includes one or more layers of $SiO_x$, $SiN_x$, $SiON$, and $Al_2O_3$. The thickness of the water-resisting layer 13 ranges from 50 nm to 1000 nm, but is not limited thereto. The water-resisting layer 13 may be manufactured by a plasma enhanced chemical vapor deposition (PECVD) process, an atomic layer deposition (ALD) process, a sputtering process, or the like, which is not limited thereto. The planarization layer 14 may be made of acrylics, siloxanes, etc., but is not limited thereto. The planarization layer 14 may be manufactured by inkjet printing, screen printing and other processes, which are not limited thereto.

Figure 12:
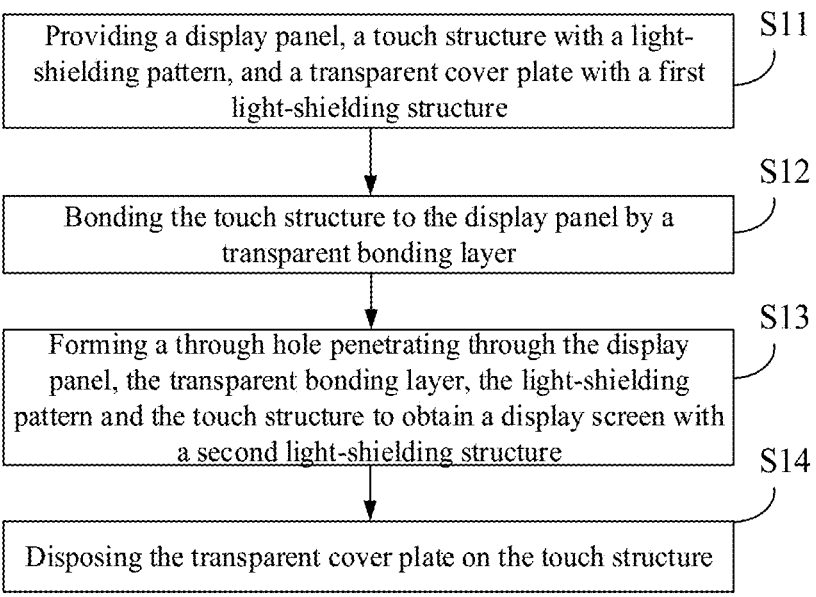
FIG. 12 is a flowchart of a method for manufacturing a display device according to an embodiment of the present disclosure.

FIG. 12 is a flowchart of a method for manufacturing a display device according to an embodiment of the present disclosure. The method is configured to manufacture the above display device. As shown in FIG. 12, the method includes the follows steps.

In S11, a display panel, a touch structure with a light-shielding pattern, and a transparent cover plate with a first light-shielding structure are provided.

In S12, the touch structure is bonded to the display panel by a transparent bonding layer.

In S13, forming a through hole penetrating through the display panel, the transparent bonding layer, the light-shielding pattern and the touch structure to obtain a display screen with a second light-shielding structure.

The structure of the display screen with the second light-shielding structure may refer to that shown in FIGS. 4 to 6. The display panel 10 includes a non-display region 101 surrounding the through hole 100a and a display region 102 surrounding the non-display region 101. The second light-shielding structure 52 includes a remaining part of the light-shielding pattern 521 after forming the through hole 100a, and surrounds the through hole 100a. The orthographic projection of the second light-shielding structure 52 onto the display panel 10 falls within the non-display region 101.

In step S14, the transparent cover plate is disposed on the touch structure.

The transparent cover plate 200 is disposed on the touch structure 30, such that the first light-shielding structure 51 surrounds the through hole 100a, and the orthographic projection of the first light-shielding structure 51 onto the display panel 10 falls within the non-display region 101. The first light-shielding structure 51 is configured to shield light through the through hole 100a and slantly incident on the transparent cover plate 200 from a side, proximal to the display panel 10, of the second light-shielding structure 52.

The first light-shielding structure on the transparent cover plate and the second light-shielding structure on the touch structure can shield the light emitted from the display panel. Since both the first light-shielding structure and the second light-shielding structure surround the through hole penetrating through the display panel, the transparent bonding layer and the touch structure, and the orthographic projections of both the first light-shielding structure and the second light-shielding structure fall within the non-display region, the light emitted from the display panel is shielded by the second light-shielding structure after slantly passing through the transparent bonding layer in the direction of the through hole, such that most of the light cannot enter the through hole, and a small part of the light enters the through hole from a side, proximal to the display panel, of the second light-shielding structure and is slantly incident on the transparent cover plate. Moreover, this part of the light is shielded by the first light-shielding structure, and thus is prevented from exiting the through hole. Thus, this part of the light is prevented from being observed by an observer, which is beneficial to the improvement of the display effect of the display device.

Figure 13:
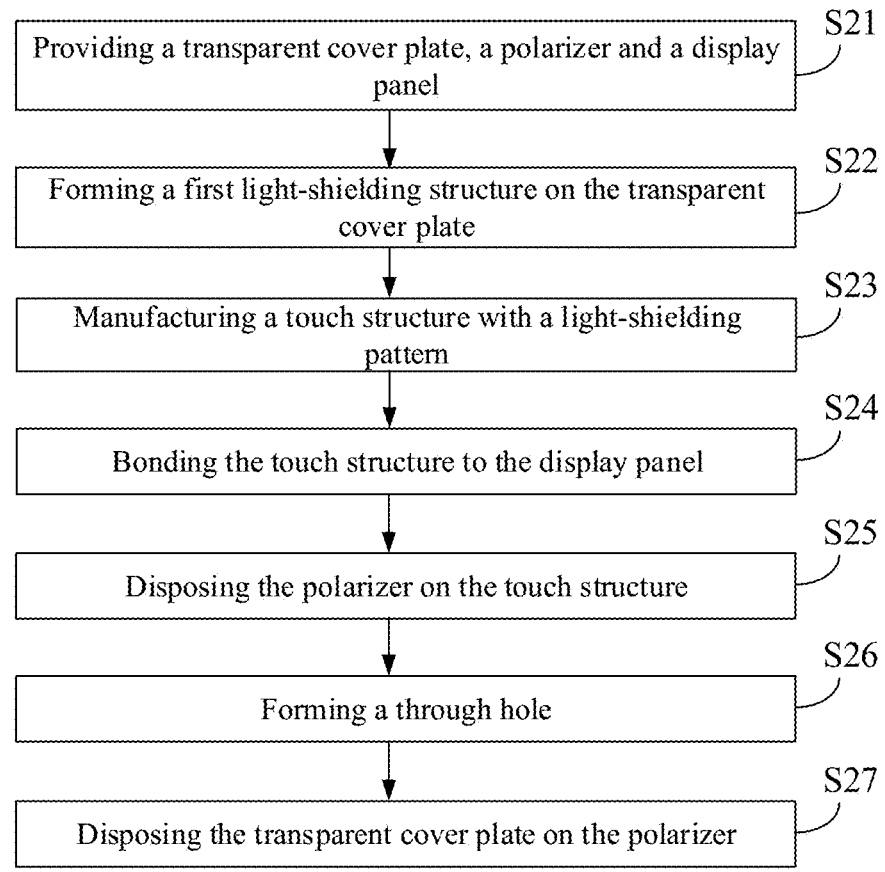
FIG. 13 is a flowchart of a method for manufacturing a display device according to another embodiment of the present disclosure.

FIG. 13 is a flowchart of a method for manufacturing a display device according to another embodiment of the present disclosure. The method for manufacturing the display device provided by the present disclosure is described in detail below with reference to FIGS. 14 to 18. As shown in FIG. 13, the method includes the following steps.

In S21, a transparent cover plate, a polarizer and a display panel are provided.

Optionally, the transparent cover plate is a cover glass. The display panel is an organic light-emitting diode display panel.

In S22, a first light-shielding structure is formed on the transparent cover plate.

Figure 14:
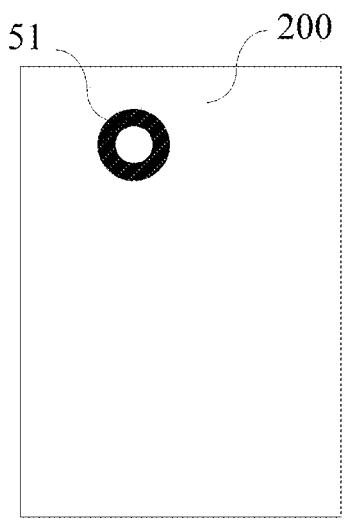
FIG. 14 is a schematic structural diagram of a transparent cover plate according to an embodiment of the present disclosure.

FIG. 14 is a schematic structure diagram of a transparent cover plate according to an embodiment of the present disclosure. As shown in FIG. 14, a first light-shielding structure 51 is formed on one surface of the transparent cover plate 200. The transparent cover plate 200 has two opposite surfaces. In a process of assembling the display device, the first light-shielding structure 51 is disposed on a surface, proximal to the display panel 10, of the transparent cover plate 200. In this way, the first light-shielding structure 51 can be prevent from falling off during the use of the display device, as the transparent cover plate 200 is a structure that can be directly touched usually.

Optionally, the first light-shielding structure 51 is made of ink or an opaque photoresist. The first light-shielding structure 51 can be formed on the transparent cover plate 200 through a screen-printing process using the ink or through a patterning process using the photoresist. Both the screen-printing process and the patterning process have higher accuracy, which is beneficial to manufacture of the first light-shielding structure 51 with high size accuracy.

If the first light-shielding structure 51 is made of the photoresist, black carbon particles may be mixed into the photoresist to enable the formed first light-shielding structure 51 to be black, such that the shielding effect of the first light-shielding structure 51 on the light is improved, thereby reducing the transmission of the light.

The first light-shielding structure 51 is ring-shaped. The inner and outer diameters of the first light-shielding structure 51 may be determined according to the above equations (1) to (5), and are not repeated herein.

In S23, the touch structure with the light-shielding pattern is manufactured.

Taking the touch structure 30 shown in FIG. 7 as an example, the touch structure 30 includes a substrate layer 31, a plurality of touch electrodes 32 and an insulating layer 33. The plurality of touch electrodes 32 is disposed on one surface of the substrate layer 31, and the insulating layer 33 covers the plurality of touch electrodes 32.

In some embodiments, the substrate layer 31 is a polyimide film, a polyethylene terephthalate thin film, or a cycloolefin polymer thin film.

The touch electrode 32 is made of indium tin oxide (ITO) which is conductive and transparent and which is suitable for manufacturing the touch electrode.

The insulating layer 33 is made of one or more of $SiO_X$, $SiN_X$ and $SiN_xO_y$.

The touch structure 30 is manufactured by at least the following two methods.

Figure 15:
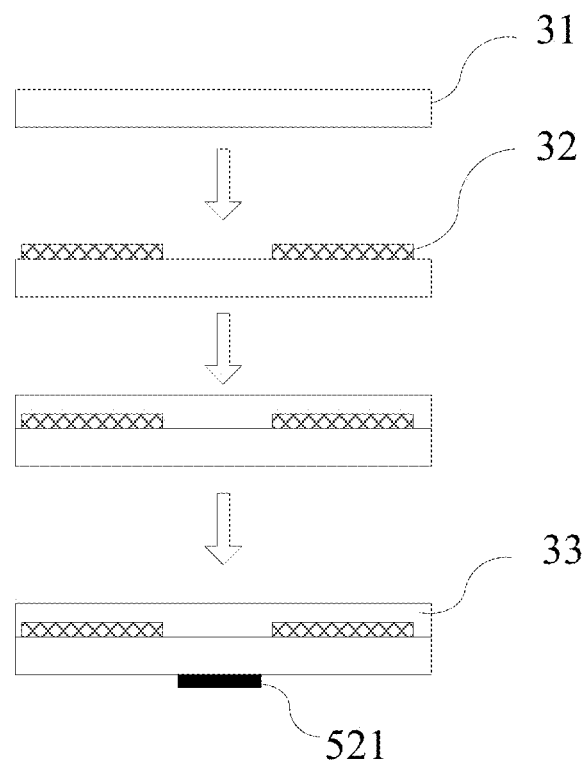
FIG. 15 is a schematic diagram showing a manufacturing process of a touch structure according to an embodiment of the present disclosure.

FIG. 15 is a schematic diagram showing a manufacturing process of a touch structure according to an embodiment of the present disclosure. As shown in FIG. 15, the first method for manufacturing the touch structure 30 may include:

providing a substrate layer 31;

forming a plurality of touch electrodes 32 on one surface of the substrate layer 31;

forming an insulating layer 33 on the plurality of touch electrodes 32; and forming a light-shielding pattern 521 on at least one of the other surface of the substrate layer 31 and the insulating layer 33 to obtain the touch structure 30.

In FIG. 15, exemplarily, the touch electrodes 32 are disposed on one surface of the substrate layer 31, and the light-shielding pattern 521 is disposed on the other surface of the substrate layer 31.

The touch structure 30 is provided with a first surface 30a and a second surface 30b opposite to each other. The light-shielding pattern 521 formed in this method is disposed on at least one of the first surface 30a and the second surface 30b.

Figure 16:
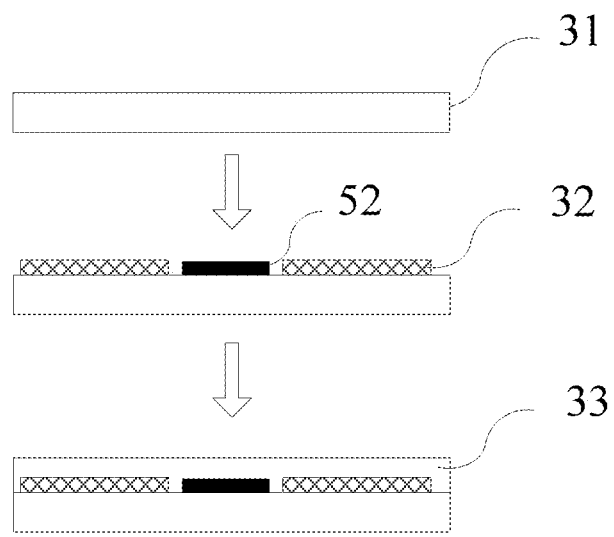
FIG. 16 is a schematic diagram showing a manufacturing process of a touch structure according to another embodiment of the present disclosure.

FIG. 16 is a schematic diagram showing a manufacturing process of a touch structure according to another embodiment of the present disclosure. As shown in FIG. 16, the second method for manufacturing the touch structure 30 may include:

providing a substrate layer 31;

forming a plurality of touch electrodes 32 and the light-shielding pattern 521 on a surface of the substrate layer 31; and forming an insulating layer 33 on the plurality of touch electrodes 32 and the light-shielding pattern 521 to obtain the touch structure 30.

The light-shielding pattern 521 formed in this method is disposed between the first surface 30a and the second surface 30b, and namely, is disposed in the touch structure 30.

The light-shielding pattern 521 is configured to manufacture the second light-shielding structure 52 in the subsequent process. Optionally, the ink or opaque photoresist is adopted to manufacture the light-shielding pattern 521. The manufacturing method of the light-shielding pattern 521 is the same as that of the first light-shielding structure 51, and both may adopt the screen-printing process or patterning process. Both the screen-printing process and the patterning process have higher accuracy, which is beneficial to the manufacture of the light-shielding pattern 521 with high size accuracy.

Figure 17:
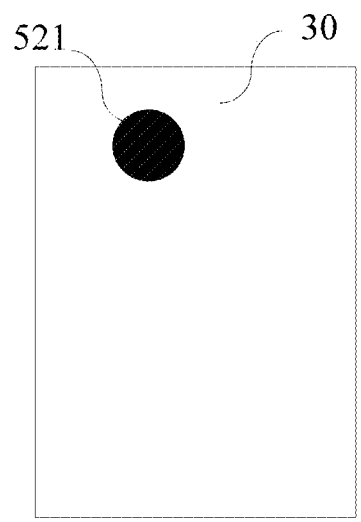
FIG. 17 is a top view of a touch structure according to yet another embodiment of the present disclosure.

FIG. 17 is a top view of a touch structure according to yet another embodiment of the present disclosure. As shown in FIG. 17, the light-shielding pattern 521 is circular. Although the light-shielding pattern 521 is circular and the second light-shielding structure 52 is ring-shaped, it is necessary to form a hole in the subsequent manufacturing process. A part of the light-shielding pattern 521 may be removed by forming the hole, such that the ring-shaped second light-shielding structure 52 is manufactured. In this way, it can ensure that the inner diameter of the manufactured second light-shielding structure 52 is the same as the diameter of the through hole 100a without designing the inner diameter of the second light-shielding structure 52.

The diameter of the light-shielding pattern 521 is the outer diameter of the second light-shielding structure 52 to be manufactured, can be determined according to the above equation (6), and is not repeated herein.

In S24, the touch structure is bonded to the display panel.

Optionally, the bonding may be performed by the transparent bonding layer 20 which is a bottom optical clear adhesive (BOCA). The BOCA is higher in transparency, and can reduce the influence on the brightness of the display screen 100.

In S25, the polarizer is disposed on the touch structure.

In S26, the through hole is formed.

Figure 18:
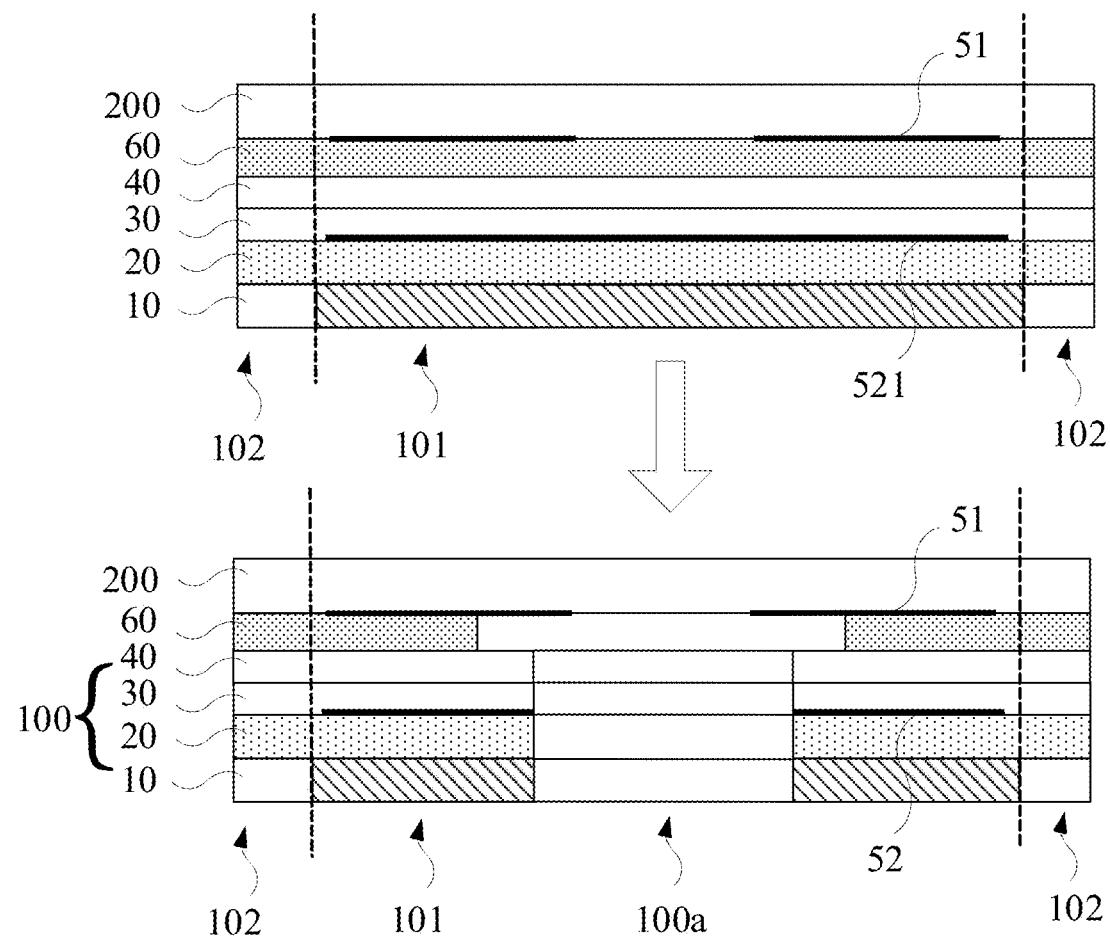
FIG. 18 is a schematic diagram showing a forming process of a through hole according to an embodiment of the present disclosure.

FIG. 18 is a schematic diagram showing a forming process of a through hole according to an embodiment of the present disclosure. As shown in FIG. 18, the through hole 100a penetrates through the display panel 10, the transparent bonding layer 20, the touch structure 30 and the polarizer 40. By forming the through hole 100a, a part of the light-shielding pattern 521 is removed, and a remaining part of the light-shielding pattern 521 is ring-shaped. The second light-shielding structure 52 is the remaining part of the light-shielding pattern 521 after forming the through hole 100a. Therefore, the display screen 100 with the second light-shielding structure 52 is acquired.

In S26, the through hole 100a penetrating through the display panel 10, the transparent bonding layer 20, the touch structure 30 and the polarizer 40 is formed by laser drilling or stamping punching.

In S27, the transparent cover plate is disposed on the polarizer.

Optionally, the transparent cover plate 200 and the polarizer 40 are bonded through a top optical clear adhesive (TOCA). The TOCA is higher in transparency and can reduce the influence on the brightness of the display panel 10.

When the transparent cover plate 200 is arranged, a relative location between the transparent cover plate 200 and the display screen 100 is adjusted, such that the first light-shielding structure 51 surrounds the through hole 100a, and the orthographic projection of the first light-shielding structure 51 onto the display panel 10 falls within the non-display region 101.

The foregoing descriptions are only optional embodiments of the present disclosure, and do not intend to limit the present disclosure. Any variation, equivalent substitution, modification and the like that fall within the spirit and principle of the present disclosure should be embraced by the protective scope of the present disclosure.

What is claimed is:

1. A display device, comprising:
   a display screen comprising:
      a display panel comprising a non-display region and a display region,
      a transparent bonding layer,
      a touch structure,
      a second light-shielding structure, and
      a through hole;
   a transparent cover plate; and
   a first light-shielding structure;
   wherein:
      the transparent bonding layer, the touch structure and the transparent cover plate are sequentially laminated on the display panel;
      the through hole penetrates through the display panel, the transparent bonding layer, and the touch structure, and the non-display region surrounds the through hole and the display region surrounds the non-display region;
      the first light-shielding structure is disposed on the transparent cover plate and surrounds the through hole, the second light-shielding structure is disposed on the touch structure and surrounds the through hole, an orthographic projection of the first light-shielding structure onto the display panel and an orthographic projection of the second light-shielding structure onto the display panel both are within the non-display region, wherein the second light-shielding structure is configured to shield light, emitted from the display panel and passing through the transparent bonding layer in the direction of the through hole; and the first light-shielding structure is configured to shield light, emitted from the display panel, passing through the through hole and being slantly incident on the transparent cover plate; and the first light-shielding structure is ring-shaped, an inner diameter of the first light-shielding structure is less than a diameter of the through hole, and an outer diameter of the first light-shielding structure is greater than the diameter of the through hole.

2. The display device according to claim 1, wherein the inner diameter of the first light-shielding structure satisfies the following relations:

$$D_1 \leq \frac{2h}{\tan\alpha} - D_0, \text{ and } \sin\alpha = \frac{nd}{a},$$

wherein $D_1$ is the inner diameter of the first light-shielding structure, h is a vertical distance between the first light-shielding structure and the second light-shielding structure, $D_0$ is the diameter of the through hole, n is a refractive index of the transparent bonding layer, d is a thickness of the transparent bonding layer, and a is a minimum distance from a boundary between the non-display region and the display region to the through hole in a radial direction of the through hole.

3. The display device according to claim 1, wherein the inner diameter of the first light-shielding structure satisfies the following relation:

$$D_1 \leq D_0 - 2\sqrt{m_1^2 + m_2^2 + m_3^2},$$

wherein $D_1$ is the inner diameter of the first light-shielding structure, $D_0$ is the diameter of the through hole, $m_1$ is a geometric tolerance of the through hole, $m_2$ is a fit tolerance between the transparent cover plate and the display panel, and $m_3$ is a geometric tolerance of the first light-shielding structure.

4. The display device according to claim 3, wherein the inner diameter of the first light-shielding structure satisfies the following relations:

$$D_1 \leq \min\left\{\frac{2h}{\tan\alpha} - D_0; D_0 - 2\sqrt{m_1^2 + m_2^2 + m_3^2}\right\}, \text{ and } \sin\alpha = \frac{nd}{a},$$

wherein h is a vertical distance between the first light-shielding structure and the second light-shielding structure, n is a refractive index of the transparent bonding layer, d is a thickness of the transparent bonding layer, and a is a minimum distance from a boundary between the non-display region and the display region to the through hole in a radial direction of the through hole.

5. The display device according to claim 1, wherein the outer diameter of the first light-shielding structure satisfies the following relation:

$$D_1 \leq D_0 - 2\sqrt{m_1^2 + m_2^2 + m_3^2},$$

wherein $D_2$ is the outer diameter of the first light-shielding structure, $D_0$ is the diameter of the through hole, a is a minimum distance from a boundary between the non-display region and the display region to the through hole in a radial direction of the through hole, $m_2$ is a fit tolerance between the transparent cover plate and the display panel, and $m_3$ is a geometric tolerance of the first light-shielding structure.

6. The display device according to claim 1, wherein the second light-shielding structure is ring-shaped; and an inner diameter of the second light-shielding structure is the same as a diameter of the through hole.

7. The display device according to claim 6, wherein an outer diameter of the second light-shielding structure satisfies the following relation:

$$D_1 \leq D_0 - 2\sqrt{m_1^2 + m_2^2 + m_3^2},$$

wherein $D_3$ is the outer diameter of the second light-shielding structure, $D_0$ is the diameter of the through hole, a is a minimum distance from a boundary between the non-display region and the display region to the through hole in a radial direction of the through hole, $m_4$ is a fit tolerance between the touch structure and the display panel, and $m_5$ is a geometric tolerance of the second light-shielding structure.

8. The display device according to claim 1, wherein the orthographic projection of the second light-shielding structure onto the display panel is within the orthographic projection of the first light-shielding structure onto the display panel.

9. The display device according to claim 1, wherein the touch structure is provided with a first surface proximal to the display panel and a second surface proximal to the transparent cover plate; wherein the second light-shielding structure is disposed on the first surface, or on the second surface, or between the first surface and the second surface.

10. The display device according to claim 9, wherein the touch structure comprises a substrate layer, a plurality of touch electrodes, and an insulating layer; wherein the plurality of touch electrodes are disposed on a surface of the substrate layer, the insulating layer covers the plurality of touch electrodes; and the second light-shielding structure is disposed on the substrate layer or on the insulating layer.

11. The display device according to claim 1, wherein a thickness of the first light-shielding structure ranges from 1 μm to 5 μm, and a thickness of the second light-shielding structure ranges from 1 μm to 5 μm.

12. The display device according to claim 1, wherein each of the first light-shielding structure and the second light-shielding structure is made of an ink or an opaque photoresist.

13. The display device of claim 12, wherein a photoresist layer comprises a black carbon particle.

14. A method for manufacturing a display device, the method comprising:

providing a display panel, a touch structure with a light-shielding pattern, and a transparent cover plate with a first light-shielding structure;

bonding the touch structure to the display panel by a transparent bonding layer;

forming a through hole penetrating through the display panel, the transparent bonding layer, the light-shielding pattern, and the touch structure to obtain a display screen with a second light-shielding structure, wherein the display panel is provided with a non-display region surrounding the through hole and a display region surrounding the non-display region, the second light-shielding structure comprises a remaining part of the light-shielding pattern after forming the through hole, and surrounds the through hole, and an orthographic projection of the second light-shielding structure onto the display panel is within the non-display region; and disposing the transparent cover plate on the touch structure, such that the first light-shielding structure surrounds the through hole, wherein an orthographic projection of the first light-shielding structure onto the display panel is within the non-display region, the second light-shielding structure is configured to shield light, emitted from the display panel and passing through the transparent bonding layer in the direction of the through hole; and the first light-shielding structure is configured to shield light, emitted from the display panel, passing through the through hole and being slantly incident on the transparent cover plate;

wherein the first light-shielding structure is ring-shaped, an inner diameter of the first light-shielding structure is less than a diameter of the through hole, and an outer diameter of the first light-shielding structure is greater than the diameter of the through hole.

15. The method according to claim 14, further comprising:

providing a substrate layer;

forming a plurality of touch electrodes on one surface of the substrate layer;

forming an insulating layer on the plurality of touch electrodes; and forming the light-shielding pattern on at least one of the insulating layer and on the other surface of the substrate layer to obtain the touch structure.

16. The method according to claim 14, further comprising:

providing a substrate layer;

forming a plurality of touch electrodes and the light-shielding pattern on a surface of the substrate layer; and forming an insulating layer on the plurality of touch electrodes and the light-shielding pattern to obtain the touch structure.

17. The method according to claim 14, wherein the second light-shielding structure is ring-shaped; and an inner diameter of the second light-shielding structure is the same as a diameter of the through hole.

18. The method according to claim 14, wherein the orthographic projection of the second light-shielding structure onto the display panel is within the orthographic projection of the first light-shielding structure onto the display panel.

* * * * *